US011677397B2

(12) United States Patent
Dey, IV et al.

(10) Patent No.: US 11,677,397 B2
(45) Date of Patent: Jun. 13, 2023

(54) TRIGGER ASSEMBLY

(71) Applicant: MILWAUKEE ELECTRIC TOOL CORPORATION, Brookfield, WI (US)

(72) Inventors: John S. Dey, IV, Milwaukee, WI (US); Jacob P. Schneider, Madison, WI (US)

(73) Assignee: MILWAUKEE ELECTRIC TOOL CORPORATION, Brookfield, WI (US)

(*) Notice: Subject to any disclaimer, the term of this patent is extended or adjusted under 35 U.S.C. 154(b) by 592 days.

(21) Appl. No.: 16/660,310

(22) Filed: Oct. 22, 2019

(65) Prior Publication Data

US 2020/0052696 A1    Feb. 13, 2020

Related U.S. Application Data

(63) Continuation of application No. 15/714,220, filed on Sep. 25, 2017, now Pat. No. 10,491,211.

(60) Provisional application No. 62/400,707, filed on Sep. 28, 2016.

(51) Int. Cl.
*H02K 7/14* (2006.01)
*H03K 17/96* (2006.01)
*H03K 17/97* (2006.01)
*H02K 11/28* (2016.01)
*G01D 5/20* (2006.01)
*H01F 5/00* (2006.01)

(52) U.S. Cl.
CPC ......... *H03K 17/9618* (2013.01); *G01D 5/202* (2013.01); *H01F 5/003* (2013.01); *H02K 11/28* (2016.01); *H03K 17/97* (2013.01); *H03K 2017/9706* (2013.01)

(58) Field of Classification Search
CPC .... G01D 5/202; H03K 17/9618; H03K 17/97; H03K 2017/9706; H02K 11/28; H01F 5/003
See application file for complete search history.

(56) References Cited

U.S. PATENT DOCUMENTS 3,352,368 A    11/1967  Maffey
4,459,522 A *   7/1984  Huber ............... H01H 9/063
                                          200/1 V
4,543,515 A     9/1985  Suzuki
5,365,155 A    11/1994  Zimmerman
(Continued)

FOREIGN PATENT DOCUMENTS

EP        1895555 A2     3/2008
WO      2013048776       4/2013

OTHER PUBLICATIONS

Extended European Search Report for Application No. 20192388.5 dated Nov. 17, 2020 (7 pages).

(Continued)

*Primary Examiner* — Kawing Chan
*Assistant Examiner* — Gabriel Agared
(74) *Attorney, Agent, or Firm* — Michael Best & Friedrich LLP

(57) ABSTRACT

A trigger assembly, for use with a power tool having an electric motor, includes a trigger, a conductor coupled for movement with the trigger, and a printed circuit board. The printed circuit board has an inductive sensor thereon responsive to relative movement between the conductor and the inductive sensor caused by movement of the trigger. An output of the inductive sensor is used to activate the electric motor.

19 Claims, 6 Drawing Sheets

(56) References Cited

U.S. PATENT DOCUMENTS

| | | | | |
|---|---|---|---|---|
| 2012/0214640 | A1* | 8/2012 | Saur | B25B 21/00 |
| | | | | 477/15 |
| 2013/0119915 | A1* | 5/2013 | Pusateri | B25F 5/00 |
| | | | | 318/504 |
| 2013/0300204 | A1* | 11/2013 | Partovi | H02J 50/50 |
| | | | | 307/104 |
| 2014/0008090 | A1* | 1/2014 | Kokinelis | B25F 5/02 |
| | | | | 173/170 |
| 2014/0232316 | A1* | 8/2014 | Philipp | H02K 7/145 |
| | | | | 318/504 |
| 2015/0369631 | A1* | 12/2015 | Cheung | H01F 27/2804 |
| | | | | 324/207.17 |
| 2016/0020443 | A1* | 1/2016 | White | H01M 50/543 |
| | | | | 318/245 |
| 2016/0178398 | A1* | 6/2016 | Krapf | H01M 10/425 |
| | | | | 429/90 |
| 2016/0354889 | A1* | 12/2016 | Ely | B25F 5/00 |

OTHER PUBLICATIONS

European Patent Office Extended Search Report for Application No. 17857255.8 dated Jan. 30, 2020 (7 pages).
International Search Report and Written Opinion for Application No. PCT/US2017/053215 dated Jan. 4, 2018, 20 pages.

* cited by examiner

TRIGGER ASSEMBLY

CROSS-REFERENCE TO RELATED APPLICATIONS

This application is a continuation of U.S. Ser. No. 15/714,220, filed Sep. 25, 2017, now U.S. Pat. No. 10,491,211, which claims priority to U.S. Provisional Patent Application No. 62/400,707 filed on Sep. 28, 2016, the entire content of which is incorporated herein by reference.

FIELD OF THE INVENTION

The present invention relates to power tools, and more particularly to trigger assemblies for power tools.

BACKGROUND OF THE INVENTION

Power tools have triggers that allow operators to activate the working element of the power tool when the working element is applied to an object. Depending on the type of power tool, triggers may be used to rotate, extend, retract, oscillate, reciprocate, speed up, and slow down the working element. Some triggers may allow an operator to cause the working element to perform more than one of these functions at the same time. Power tools may also include multiple triggers that are separately dedicated to these different functions.

SUMMARY OF THE INVENTION

The present invention provides, in one aspect, a trigger assembly for use with a power tool having an electric motor. The trigger assembly includes a trigger, a conductor coupled for movement with the trigger, and a printed circuit board. The printed circuit board has an inductive sensor thereon responsive to relative movement between the conductor and the inductive sensor caused by movement of the trigger. An output of the inductive sensor is used to activate the electric motor.

The present invention provides, in another aspect, a power tool having an electric motor, a controller in electrical communication with the motor to activate and deactivate the motor, a trigger, a conductor coupled for movement with the trigger, and a printed circuit board. The printed circuit board has an inductive sensor thereon responsive to relative movement between the conductor and the inductive sensor caused by movement of the trigger. An output of the inductive sensor is detected by the controller, which in response activates or deactivates the electric motor.

The present invention provides, in yet another aspect, a method of operating a power tool. The method includes pressing a trigger in a first direction, moving a conductor over an inductive sensor, outputting a signal from the inductive sensor, and activating an electric motor based on the signal.

Other features and aspects of the invention will become apparent by consideration of the following detailed description and accompanying drawings.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting.

DETAILED DESCRIPTION

Figure 1:
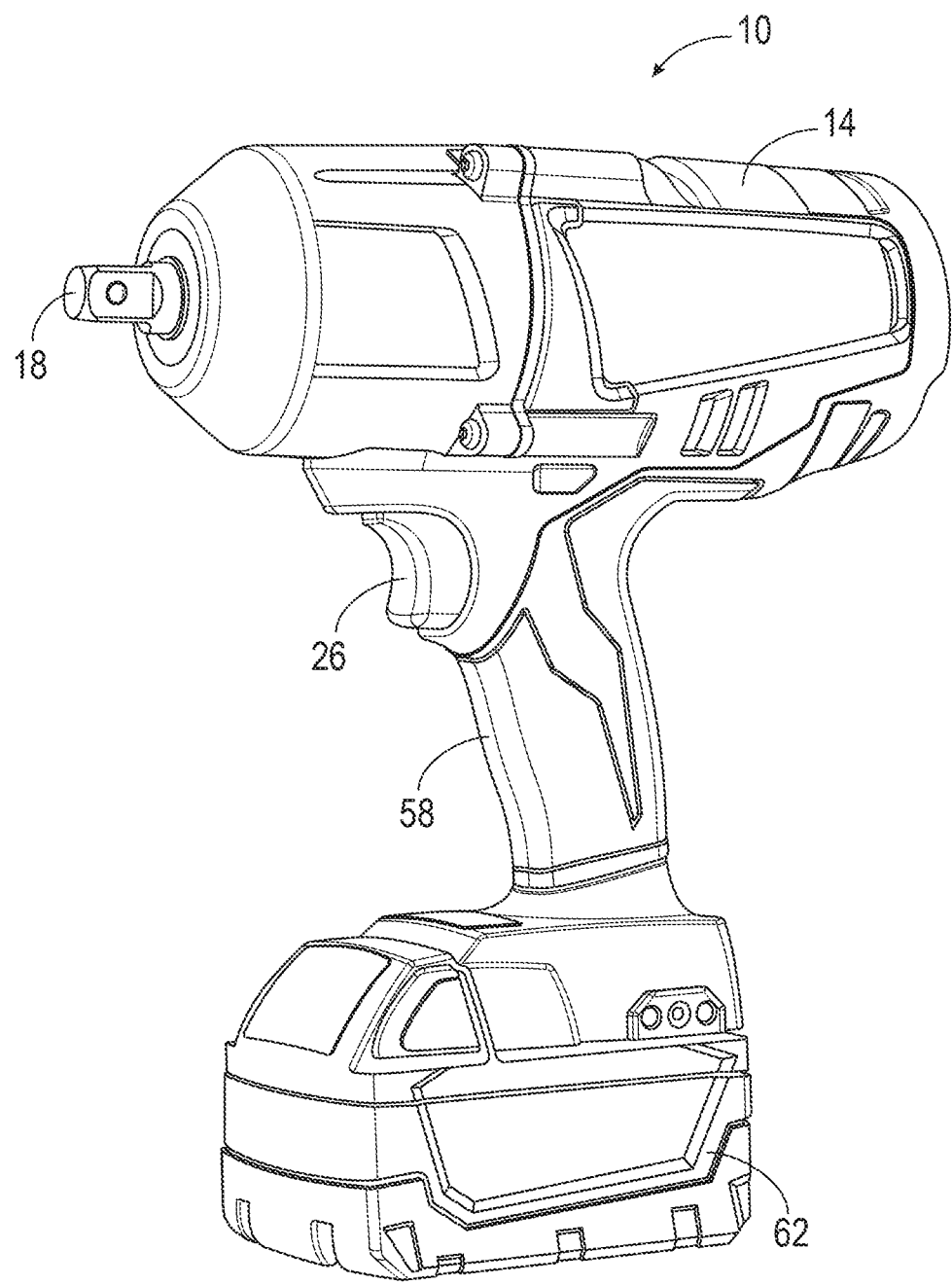
FIG. 1 is a perspective view of a power tool in which a trigger assembly of the invention may be incorporated.
Figure 9:
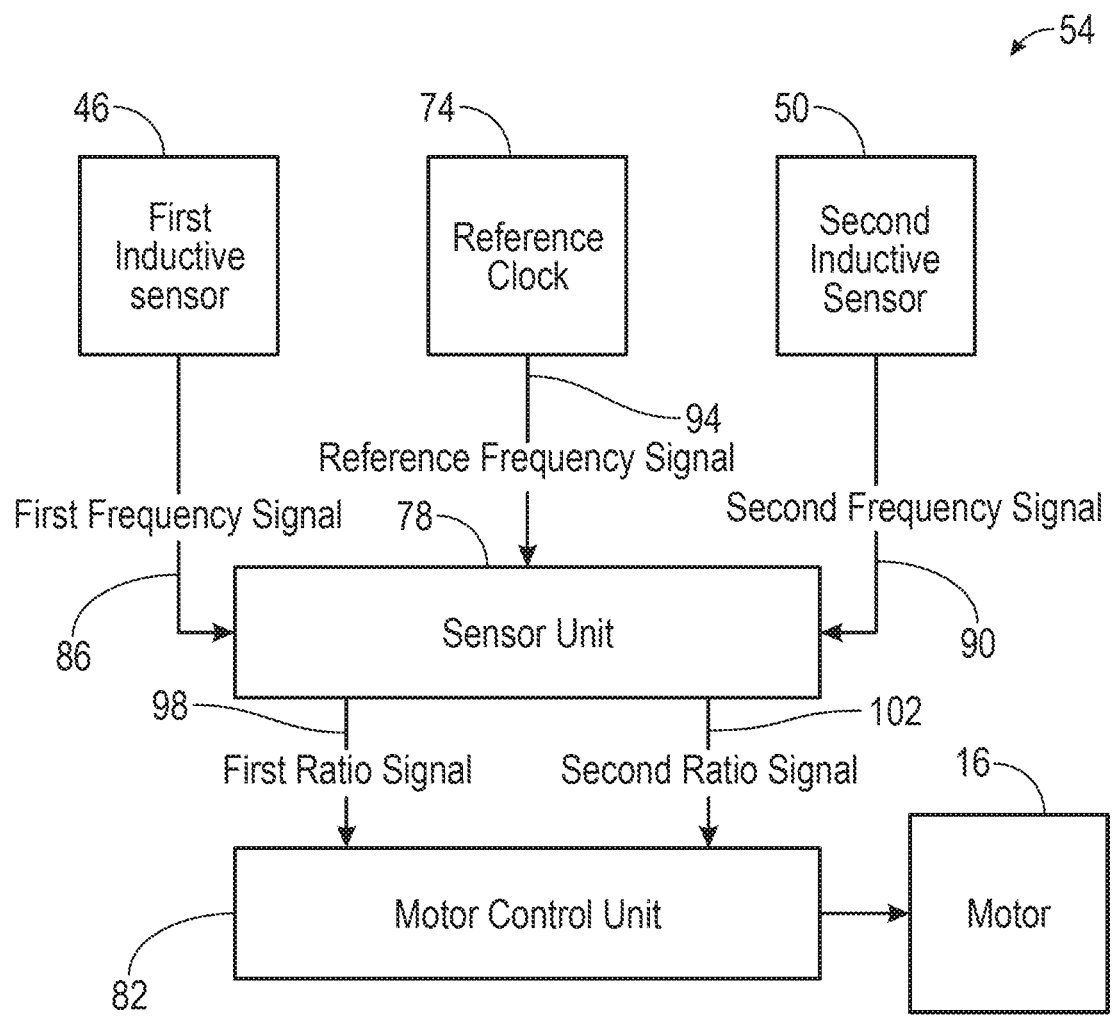
FIG. 9 is a flow diagram showing the electrical communication between the first and second inductive sensors of the trigger assembly, a reference clock, a sensor unit, and a motor control unit on a printed circuit board.

FIG. 1 illustrates a power tool 10 (e.g., an impact wrench) including a housing 14, an electric motor (e.g., a brushless electric motor 16; FIG. 9) disposed within the housing 14, and an output shaft which, either directly or indirectly, performs work on a workpiece during operation of the tool 10. In the illustrated embodiment, the output shaft is configured as an anvil 18 having a square drive for attachment to a corresponding size socket. However, the output shaft may include a different configuration or may include a conventional chuck for receipt of any of a number of different tool bits. Furthermore, the power tool 10 may be configured as a non-impact rotary tool (e.g., a drill or screwdriver) or a non-rotary power tool.

Figure 2:
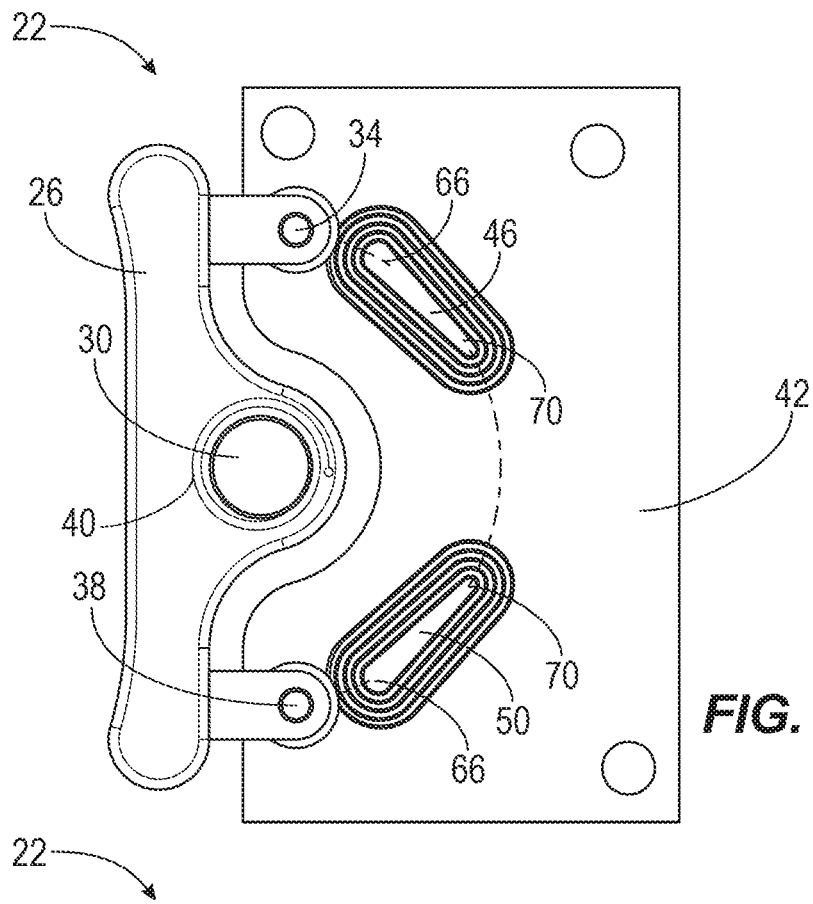
FIG. 2 is a plan view of a trigger assembly in accordance with an embodiment of the invention, with a trigger shown in a neutral position.

With reference to FIG. 2, the power tool 10 also includes a trigger assembly 22 for activating and deactivating the motor 16. The trigger assembly 22 includes a trigger 26 pivotably coupled to the housing 14 by a pivot 30, first and second conductors 34, 38 (e.g., pieces of ferrous or non-ferrous metal) supported by the trigger 26 on opposite sides of the pivot 30, and a torsion spring 40 for biasing the trigger 26 toward a neutral or "home" position (shown in FIG. 2). The trigger assembly 22 also includes a printed circuit board ("PCB") 42 having thereon first and second inductive sensors 46, 50, which are also components of a control system 54 shown in FIG. 9. The PCB 42 is positioned in close proximity to the trigger 26 in a grip portion 58 of the housing 14 (FIG. 1). A power source, such as a battery 62, provides power to the PCB 42 and the motor 16 when activated by the trigger assembly 22.

With reference to FIG. 2, the first and second inductive sensors 46, 50 are configured as coil traces on the PCB 42. When an AC voltage is applied to each of the sensors, 46, 50, an electromagnetic field is created. Based on Faraday's Law of Induction, a voltage will be induced in the conductors 34, 38 in response to relative movement between the conductors 34, 38 and the magnetic fields of the respective inductive sensors 46, 50 which, in turn, produces Eddy currents in the conductors 34, 38 that oppose the electromagnetic fields created by the respective inductive sensors 46, 50. This changes the inductance of the inductive sensors 46, 50, which can be measured and used as an indicator of the presence or physical proximity of the conductors 34, 38 relative to the sensors 46, 50. Although not schematically illustrated in FIG. 9, each of the inductive sensors 46, 50 is configured as an LC tank circuit, the frequency of which (hereinafter, the "sensor frequency") changes in response to a change in inductance.

As shown in FIG. 2, each of the inductive sensors 46, 50 is elongated and has a uniform number or density of windings throughout the length of the sensors 46, 50 between a proximal end 66 and a distal end 70 of each of the sensors 46, 50. In this embodiment of the trigger assembly 22, the measured change in inductance of the sensors 46, 50 in response to movement of the conductors 34, 38 relative to the sensors 46, 50 can be used to activate the motor 16 for rotation at a constant speed in either a forward or reverse direction, depending upon which direction the trigger 26 is pivoted.

As shown in FIG. 9, the control system 54 also includes a reference clock 74, which is also configured as an LC tank circuit. However, the reference clock 74 is isolated from the conductors 34, 38 and therefore is operable to output a constant reference frequency, the purpose of which is described in detail below. The control system 54 also includes a sensor unit 78, which receives the output of the inductive sensors 46, 50 and the reference clock 74, and a motor control unit ("MCU") 82 electrically coupled to the motor 16. The sensor unit 78 continuously receives a first frequency signal 86 indicative of the sensor frequency of the first inductive sensor 46, a second frequency signal 90 indicative of the sensor frequency of the second inductive sensor 50, and a reference frequency signal 94 indicative of the reference frequency of the reference clock 74.

Using the sensor frequency signals 86, 90 and the reference frequency signal 94 as inputs, the sensor unit 78 is operable to calculate a frequency ratio, which is a ratio of the sensor frequency to the reference frequency. Specifically, the sensor unit 78 calculates a first frequency ratio and a second frequency ratio, and digitally outputs a first ratio signal 98 indicative of the first frequency ratio and a second ratio signal 102 indicative of the second frequency ratio to the MCU 82. The MCU 82 is operable to interpolate the first and second ratio signals 98, 102 to determine whether the trigger 26 has been depressed and in which direction (e.g., clockwise about the pivot 30 or counter-clockwise). Specifically, if the first ratio signal 98 deviates from an expected initial value (e.g., a ratio of 1:1) while the second ratio signal 102 remains unchanged, the MCU 82 associates this situation with the trigger 26 being pivoted in a clockwise direction from the neutral position shown in FIG. 2 toward the position shown in FIG. 3, coinciding with the first conductor 34 moving over the first inductive sensor 46. Furthermore, the MCU 82 associates pivoting the trigger 26 in a clockwise direction with activating the motor 16 in a forward direction at a constant and predetermined speed. Likewise, if the second ratio signal 102 deviates from an expected initial value (e.g., a ratio of 1:1) while the first ratio signal 98 remains unchanged, the MCU 82 associates this situation with the trigger 26 being pivoted in a counter-clockwise direction from the neutral position shown in FIG. 2 toward the position shown in FIG. 4, coinciding with the second conductor 38 moving over the second inductive sensor 50. Furthermore, the MCU 82 associates pivoting the trigger 26 in a counter-clockwise direction with activating the motor 16 in a reverse direction at a constant and predetermined speed.

Figure 3:
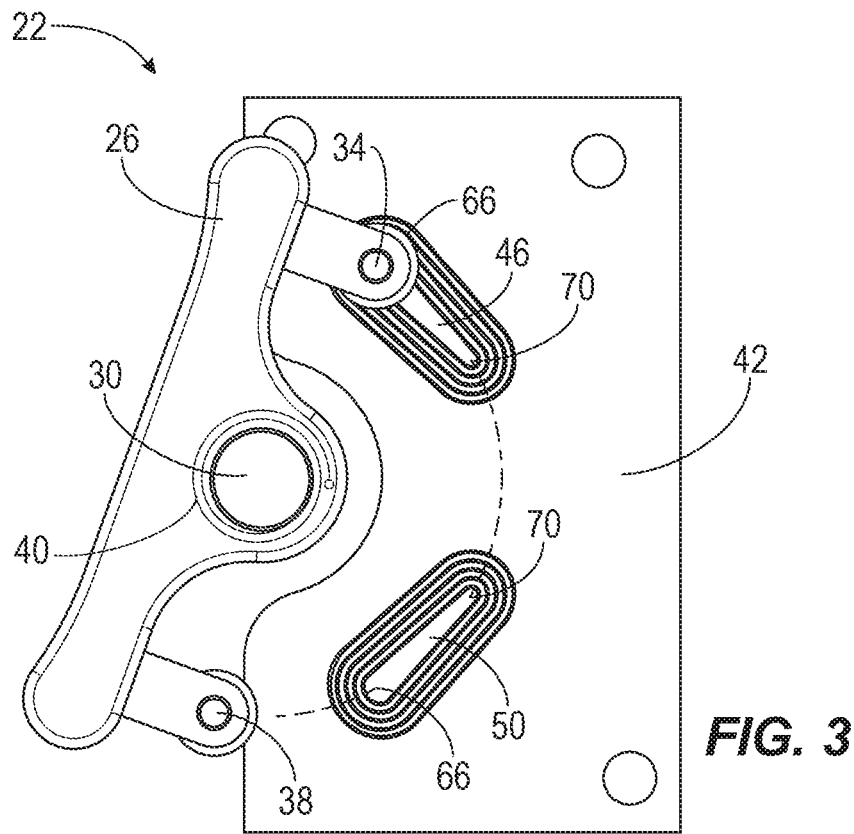
FIG. 3 is a plan view of the trigger assembly of FIG. 2, illustrating the trigger rotating in a clockwise direction over a first inductive sensor.
Figure 4:
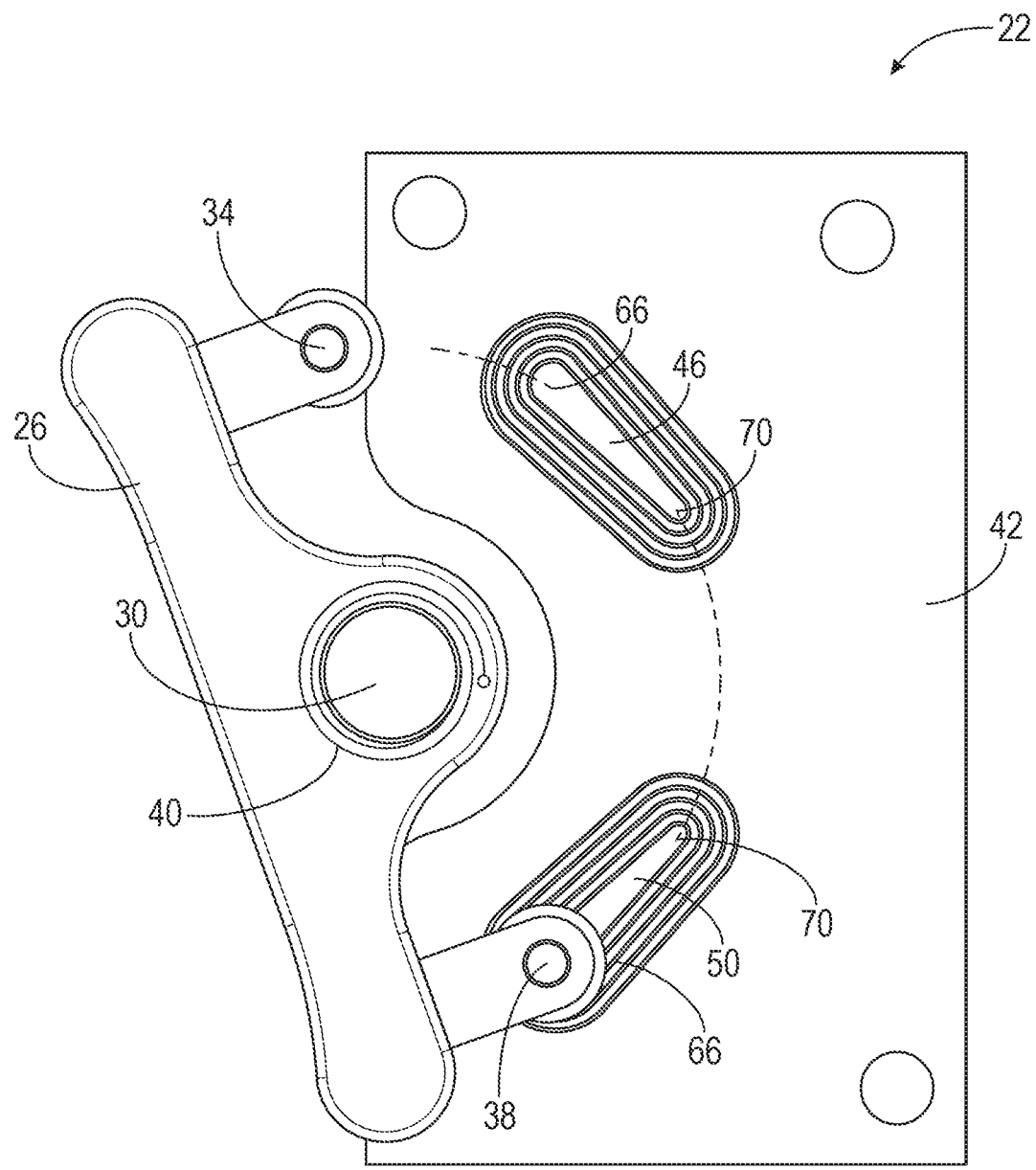
FIG. 4 is a plan view of the trigger assembly of FIG. 2, illustrating the trigger rotating in a counter-clockwise direction over a second inductive sensor.

In operation of the power tool 10 using the embodiment of the trigger assembly 22 shown in FIGS. 2-4, to activate the motor 16 in a forward direction, the operator pivots the trigger 26 from the neutral position shown in FIG. 2 to the position shown in FIG. 3, causing the first conductor 34 to move over the first inductive sensor 46. This changes the inductance of the first inductive sensor 46, which in turn also causes the sensor frequency of the first inductive sensor 46 to change. As described above, this change is detected by the MCU 82, which then activates the motor 16 in a forward direction at a constant speed. When the operator releases the trigger, it is returned to the neutral position shown in FIG. 2 by the torsion spring, again causing the first conductor 34 to move over the first inductive sensor 46. This action again causes a change in the sensor frequency of the first inductive sensor 46, which is interpolated by the MCU 82 (as a result of the first ratio signal 98 deviating from an initial value) as the trigger 26 returning to the neutral position. Thereafter, the MCU 82 deactivates the motor 16, thus stopping forward rotation of the anvil 18.

Likewise, to activate the motor 16 in a reverse direction, the operator pivots the trigger 26 from the neutral position shown in FIG. 2 to the position shown in FIG. 4, causing the second conductor 38 to move over the second inductive sensor 50. This changes the inductance of the second inductive sensor 50, which in turn also causes the sensor frequency of the second inductive sensor 50 to change. As described above, this change is detected by the MCU 82, which then activates the motor 16 in a reverse direction at a constant speed. When the operator releases the trigger 26, it is returned to the neutral position shown in FIG. 2 by the torsion spring, again causing the second conductor 38 to move over the second inductive sensor 50. This action again causes a change in the sensor frequency of the second inductive sensor 50, which is interpolated by the MCU 82 (as a result of the second ratio signal 102 deviating from an initial value) as the trigger 26 returning to the neutral position. Thereafter, the MCU 82 deactivates the motor 16, thus stopping reverse rotation of the anvil 18.

Figure 5:
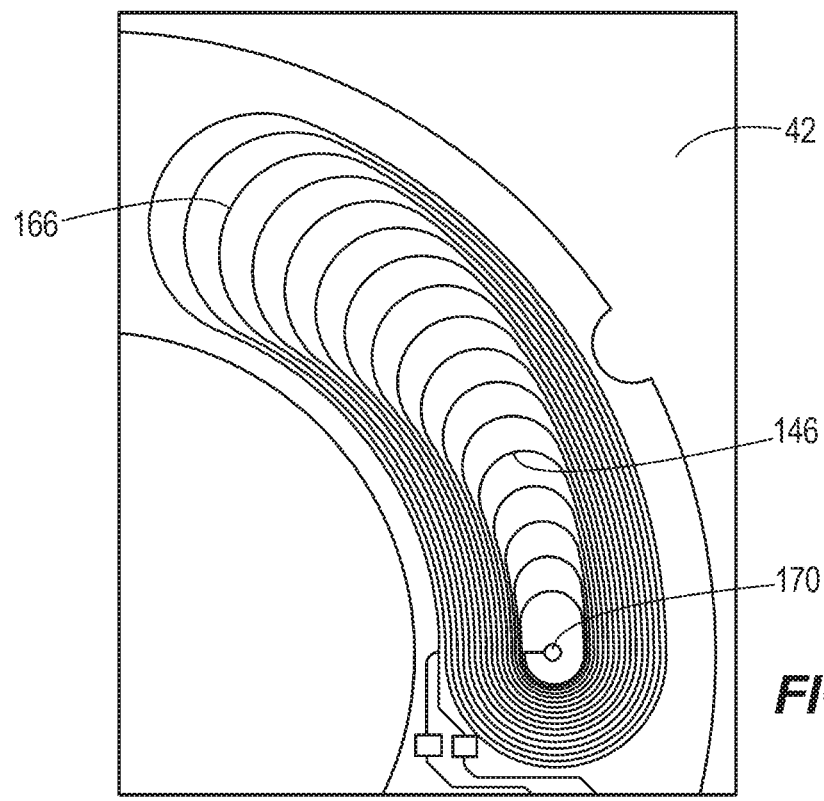
FIG. 5 is a plan view of an alternate configuration of the first inductive sensor shown in FIGS. 2-4.
Figure 6:
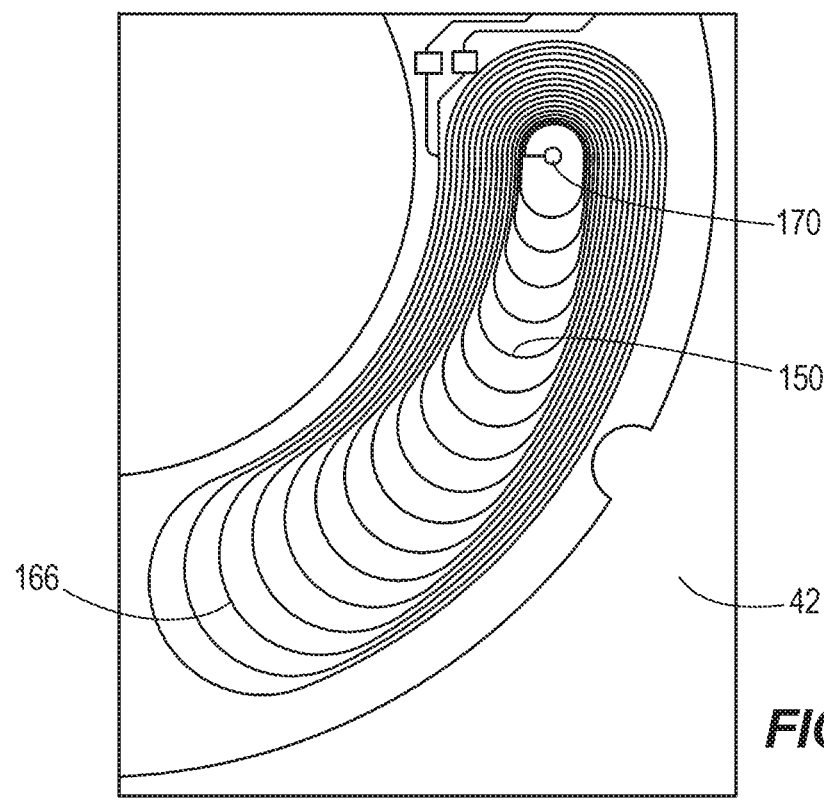
FIG. 6 is a plan view of an alternate configuration of the second inductive sensor shown in FIG. 2-4.

In another embodiment of the trigger assembly (with like features being identified with like reference numerals), the uniform inductive sensors 46, 50 shown in FIGS. 2-4 may be replaced with inductive sensors 146, 150 having a non-uniform winding density along the length of the inductive sensors 146, 150 (FIGS. 5 and 6). In other words, each of the inductive sensors 146, 150 includes a relatively low winding density at a proximal end 166 of the sensors 146, 150 (i.e., an end closest to the respective conductors 34, 38 when the trigger 26 is in the neutral position) and a relatively high winding density at a distal end 170 of the sensors 146, 150 (i.e., an end farthest from the respective conductors 34, 38 when the trigger 26 is in the neutral position). In this embodiment of the trigger assembly, the MCU 82 is also operable to control the speed at which the motor 16 operates in proportion to the degree to which the trigger 26 is pivoted.

In operation of the power tool 10 using the embodiment of the trigger assembly with the inductive sensors 146, 150 of FIGS. 5 and 6, to activate the motor 16 in a forward direction, the operator pivots the trigger 26 from the neutral position shown in FIG. 2 in a clockwise direction, causing the first conductor 34 to move over the first inductive sensor 146. This changes the inductance of the first inductive sensor 146, which in turn also causes the sensor frequency of the first inductive sensor 146 to change. However, rather than the first ratio signal changing between an expected initial value (e.g., 1:1) and an alternate value (e.g., one greater than or less than 1:1) as is the case when using the inductive sensors 46, 50 of FIG. 2 having a uniform winding density, the first ratio signal input 98 to the MCU 82 continuously changes from the initial value (e.g., 1:1) to a final (e.g., a maximum or minimum) value coinciding with placement of the first conductor 34 above the distal end 170 of the first inductive sensor 146. This change is detected by the MCU 82 which, depending upon the degree to which the trigger 26 is pivoted in the clockwise direction, activates the motor 16 in a forward direction at a rotational speed that is proportional to the degree to which the trigger 26 is pivoted.

If the trigger 26 is pivoted to an intermediate position and then held stationary, the MCU 82 will continue to drive the motor 16 at a constant rotational speed proportional to the degree to which the trigger 26 is initially pivoted, until the trigger 26 is either depressed to pivot the trigger 26 further in a clockwise direction (to thereby accelerate the motor 16 to a higher speed) or released to deactivate the motor 16. If the trigger 26 is further pivoted in the clockwise direction, the first conductor 34 is moved further along the length of the first inductive sensor 146, closer to the distal end 170 of the first inductive sensor 146. This action again causes a change in the sensor frequency of the first inductive sensor 146, with the magnitude of the first ratio signal 98 moving further from the initial value (e.g., 1:1) and toward the final (e.g., a maximum or minimum) value, prompting the MCU 82 to accelerate the motor 16 to a rotational speed proportional with the degree to which the trigger 26 is pivoted in the clockwise direction. The MCU 82 is also operable to drive the motor 16 at a variable rotational speed as described above, but in a reverse direction, in response to the trigger 26 being pivoted in a counter-clockwise direction from the neutral position shown in FIG. 2.

Figure 7:
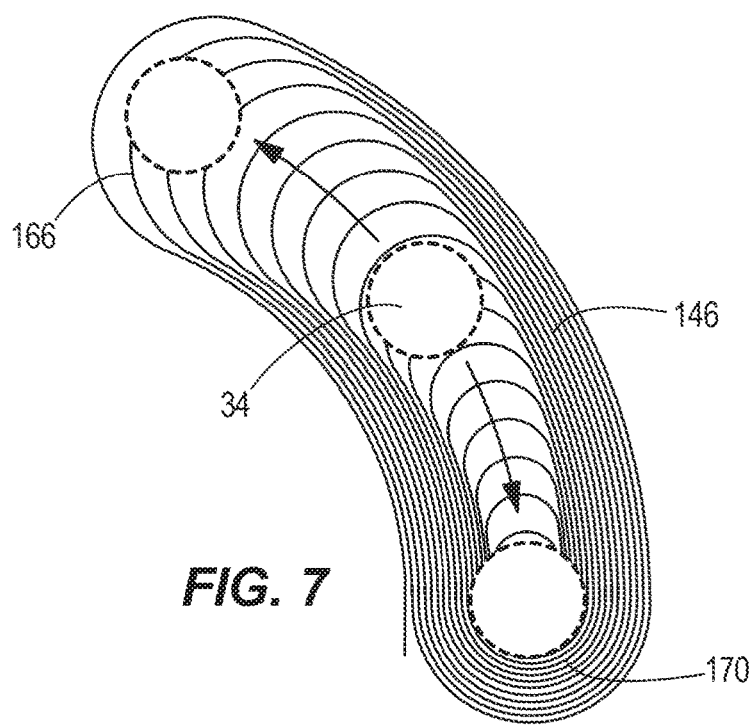
FIG. 7 is a plan view of a trigger assembly, with portions removed for clarity, in accordance with another embodiment of the invention.

FIG. 7 illustrates a trigger assembly in accordance with another embodiment of the invention, with like features being shown with like reference numerals. The trigger assembly is similar to that described above using the inductive sensors 146, 150 shown in FIGS. 5 and 6, but the second conductor 38 and the second inductive sensor 150 are omitted. And, in the neutral position of the trigger 26, the first conductor 34 is located approximately between the proximal and distal ends 166, 170 of the first (and only) inductive sensor 146.

In this embodiment, the MCU 82 is programmed to activate and drive the motor 16 in a forward direction at a rotational speed proportional to the degree to which the trigger 26 is pivoted in a clockwise direction from the neutral position, which further displaces the first conductor 34 toward the distal end 170 of the first inductive sensor 146. Likewise, the MCU 82 is programmed to activate and drive the motor 16 in a reverse direction at a rotational speed proportional to the degree to which the trigger 26 is pivoted in a counter-clockwise direction from the neutral position, which further displaces the first conductor 34 toward the proximal end 166 of the first inductive sensor 146. When the operator releases the trigger 26, it is returned to its neutral position by the torsion spring, again causing the first conductor 34 to move over the first inductive sensor 146. This action again causes a change in the sensor frequency of the first inductive sensor 146, which is interpolated by the MCU 82 as the trigger returning to the neutral position (coinciding with placement of the first conductor 34 approximately between the proximal and distal ends 166, 170 of the first inductive sensor 146). Thereafter, the MCU 82 deactivates the motor 16, thus stopping rotation of the anvil 18.

Figure 8:
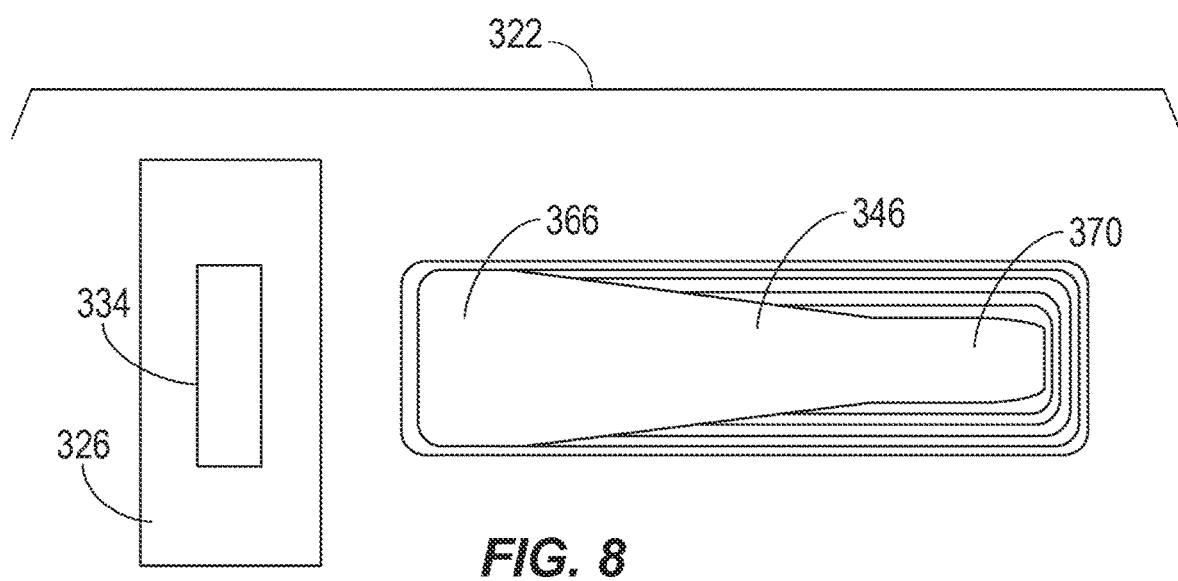
FIG. 8 is a plan view of a trigger assembly in accordance with yet another embodiment of the invention.

A trigger assembly 322 in accordance with yet another embodiment of the invention is shown in FIG. 8. In this embodiment, a slidable trigger 326 supporting a conductor 334 thereon is employed. The slidable trigger 326 is biased by a spring to a neutral position spaced from a single, linear inductive sensor 346 having a non-uniform winding density. In this embodiment, a separate direction switch (not shown) on the housing 14 of the power tool 10 is employed to toggle rotation of the motor 16 between forward and reverse directions. In the same manner as described above, the MCU 82 is programmed to increase the rotational speed of the motor 16 as the slidable trigger 326 slides over the inductive sensor 346 as the conductor 334 approaches the distal end 370 of the inductive sensor 346. Likewise, the MCU 82 is programmed to decrease the rotational speed of the motor 16 as the slidable trigger 326 slides over the inductive sensor 346 in an opposite direction as the conductor 334 approaches the proximal end 366 of the inductive sensor 346. And, the MCU 82 is programmed to hold the rotational speed of the motor 16 at a constant value if the slidable trigger 326 stops anywhere between the proximal and distal ends 366, 370 of the inductive sensor 346.

The trigger assemblies of FIGS. 2-7 allow the motor 16 to be controlled without a secondary direction switch to otherwise toggle the motor 16 between forward and reverse rotational directions, thus reducing the number of components required to manufacture the tool 10 and the attendant cost. Also, because the inductive sensors 46, 50, 146, 150, 346 function as non-contact switches, the trigger assemblies 22, 322 disclosed herein are expected to have greater longevity than a traditional contact-based trigger switch, which can wear over time.

Various features of the invention are set forth in the following claims.

What is claimed is:
1. A power tool comprising:
an electric motor;
a controller in electrical communication with the motor to activate and deactivate the motor;
a trigger;
a conductor coupled for movement with the trigger;
a printed circuit board having an inductive sensor thereon responsive to relative movement between the conductor and the inductive sensor caused by movement of the trigger, wherein an output of the inductive sensor is detected by the controller, which in response activates or deactivates the electric motor;
a sensor unit in communication with the controller; and
a reference clock configured to provide a reference frequency signal to the sensor unit that is indicative of a reference frequency of the reference clock,
wherein the output of the inductive sensor is a sensor frequency signal indicative of a sensor frequency of the inductive sensor, wherein the sensor frequency of the inductive sensor is configured to change based on relative movement between the conductor and the inductive sensor,
wherein the sensor unit is configured to receive the sensor frequency signal from the inductive sensor and output a ratio signal to the controller, which is a ratio of the sensor frequency to the reference frequency, and wherein the controller activates or deactivates the motor based upon the ratio signal.

2. The power tool of claim 1, wherein the inductive sensor is first inductive sensor, the conductor is a first conductor, and the output is a first output, and wherein the power tool further comprises
  a second conductor coupled for movement with the trigger, and
  a second inductive sensor on the printed circuit board responsive to relative movement between the second conductor and the second inductive sensor caused by movement of the trigger, wherein a second output of the second inductive sensor is detected by the controller, which in response activates the electric motor.

3. The power tool of claim 2, wherein the first output of the first inductive sensor is detected by the controller, which in response activates the electric motor in a first rotational direction, and wherein the second output of the second inductive sensor is detected by the controller, which in response activates the electric motor in a second rotational direction that is different than the first rotational direction.

4. The power tool of claim 1, wherein the inductive sensor is a coil trace having a proximal end located proximate the trigger and a distal end, and wherein the distal end has a different winding density than the proximal end.

5. The power tool of claim 4, wherein, in response to the conductor moving away from the proximal end of the inductive sensor and towards the distal end, a rotational speed of the motor is accelerated by the controller, and wherein, in response to the conductor moving away from the distal end of the inductive sensor and towards the proximal end, the rotational speed of the motor is decelerated by the controller.

6. The power tool of claim 5, further comprising a spring biasing the trigger toward a neutral position in which the conductor is closer to the proximal end than the distal end.

7. The power tool of claim 6, wherein the conductor is a first conductor, the coil trace is a first coil trace, and the output is a first output detected by the controller to activate the motor in a first rotational direction, and wherein the power tool further comprises
  a second conductor coupled for movement with the trigger, and
  a second inductive sensor configured as a second coil trace on the printed circuit board having a proximal end located proximate the trigger and a distal end, wherein the distal end of the second coil trace has a different winding density than the proximal end of the second coil trace,
  wherein the second inductive sensor is responsive to relative movement between the second conductor and the second inductive sensor caused by movement of the trigger, and wherein a second output of the second inductive sensor is detected by the controller, which in response activates the motor in a second rotational direction that is different than the first rotational direction,
  wherein, in response to the second conductor moving away from the proximal end of the second coil trace and towards the distal end of the second coil trace, a rotational speed of the electric motor is accelerated by the controller, and wherein in response to the second conductor moving away from the distal end of the second coil trace and towards the proximal end of the second coil trace, the rotational speed of the motor is decelerated by the controller.

8. The power tool of claim 1, wherein the inductive sensor is a coil trace having a first end and a second end that has a different coil density than the first end, and wherein the power tool further comprises
  a spring biasing the trigger to a position in which the conductor is located in a neutral position between the first end and the second end,
  wherein, in response to the conductor moving away from the neutral position and towards the first end of the coil trace, the output of the inductive sensor is detected by the controller, which in response activates the motor in a first rotational direction and accelerates a rotational speed of the motor, and
  wherein, in response to the conductor moving away from the neutral position and towards the second end of the coil trace, the output of the inductive sensor is detected by the controller, which in response activates the motor in an opposite, second rotational direction and accelerates the rotational speed of the motor.

9. The power tool of claim 1, wherein the controller is configured to activate the motor in one of a first rotational direction or an opposite, second rotational direction in response to a change in the first ratio signal.

10. The power tool of claim 1, wherein a parameter of the motor is controlled in proportion to the movement of the trigger using the output of the inductive sensor.

11. The power tool of claim 1, wherein the conductor moves between a first position and a second position, wherein the first position is outside the detection area of the inductive sensor and the second position is within the detection area of the inductive sensor.

12. A method of operating a power tool, the method comprising:
  pressing a trigger in a first direction;
  moving a conductor over an inductive sensor;
  outputting a sensor frequency signal from the inductive sensor indicative of a sensor frequency of the inductive sensor, wherein the sensor frequency of the inductive sensor is configured to change based on relative movement between the conductor and the inductive sensor;
  activating, using a controller of the power tool, an electric motor based on the signal;
  receiving a reference frequency signal indicative of a reference frequency of a reference clock; and
  receiving the sensor frequency signal from the inductive sensor and outputting a ratio signal to the controller, which is a ratio of the sensor frequency to the reference frequency, and wherein the motor is activated or deactivated based upon the ratio signal.

13. The method of claim 12, wherein the inductive sensor is a coil trace having a proximal end located proximate the trigger and a distal end, and wherein the distal end has a different winding density than the proximal end, and wherein the method further comprises:
  moving the conductor away from the proximal end of the inductive sensor and towards the distal end of the inductive sensor; and
  accelerating the rotational speed of the motor as the conductor is moved from the proximal end of the inductive sensor towards the distal end.

14. The method of claim 13, further comprising:
  releasing the trigger;
  biasing the trigger in a second direction that is opposite the first direction;
  moving the conductor away from the distal end of the inductive sensor and towards the proximal end of the inductive sensor; and decelerating the rotational speed of the motor as the conductor is moved from the distal end of the inductive sensor to towards the proximal end.

15. The method of claim 12, wherein activating the electric motor comprises activating the electric motor in a first rotational direction.

16. The method of claim 15, wherein pressing the trigger in the first direction comprises pivoting the trigger in a first pivotal direction, wherein the conductor is a first conductor and the inductive sensor is a first inductive sensor, and wherein the method further comprises:
    pivoting the trigger in a second pivotal direction that is opposite the first pivotal direction;
    moving a second conductor over a second inductive sensor;
    outputting a second signal from the second inductive sensor; and
    activating the electric motor in a second rotational direction that is different than the first rotational direction based on the second signal.

17. The method of claim 12, further comprising controlling the motor in proportion to the movement of the trigger using the output of the inductive sensor.

18. The method of claim 12, further comprising moving the conductor between a first position and a second position, wherein the first position is outside the detection area of the inductive sensor and the second position is within the detection area of the inductive sensor.

19. The method of claim 12, wherein the motor is activated in one of a first rotational direction or an opposite, second rotational direction in response to a change in the first ratio signal.

* * * * *